United States Patent [19]
Koura

[11] Patent Number: 6,069,833
[45] Date of Patent: May 30, 2000

[54] VOLTAGE DROP CIRCUIT ENABLING ROM TO READ DATA WITH HIGH RELIABILITY

[75] Inventor: Masato Koura, Tokyo, Japan

[73] Assignee: Mitsubishi Denki Kabushiki Kaisha, Tokyo, Japan

[21] Appl. No.: 09/304,666

[22] Filed: May 4, 1999

[30] Foreign Application Priority Data

Jan. 5, 1999 [JP] Japan ................................. 11-000736

[51] Int. Cl.⁷ .................................................. G11C 8/00
[52] U.S. Cl. .......................................... 365/226; 365/229
[58] Field of Search ..................... 365/226, 229

[56] References Cited

U.S. PATENT DOCUMENTS 5,212,797  5/1993  Miyake et al. ............................ 395/750
5,898,621  4/1999  Takahashi et al. ................. 365/185.33

FOREIGN PATENT DOCUMENTS 10-125061   5/1998   Japan .

*Primary Examiner*—David Nelms
*Assistant Examiner*—M. Tran
*Attorney, Agent, or Firm*—Burns, Doane, Swecker & Mathis, LLP

[57] ABSTRACT

A voltage drop circuit for generating an active voltage to be supplied to a ROM by dropping a supply voltage. The voltage drop circuit inhibits an access of a CPU to the ROM for a predetermined time period immediately after the ROM shifts from a standby mode to an active mode. This makes it possible to solve a problem of a conventional voltage drop circuit in that it is not unlikely that the CPU cannot read data correctly from the ROM for a moment immediately after the ROM shifts from the standby mode to the active mode because of fluctuations of the active voltage in that moment.

7 Claims, 4 Drawing Sheets

ERASE COMMAND PHASE SIGNAL

WRITE COMMAND PHASE SIGNAL

READ COMMAND PHASE SIGNAL

RAM ACCESS SIGNAL

EXTERNAL AREA ACCESS SIGNAL

MICROPROCESSOR MODE SIGNAL

STOP SIGNAL

VOLTAGE DROP CIRCUIT ENABLING ROM TO READ DATA WITH HIGH RELIABILITY

BACKGROUND OF THE INVENTION

1. Field of the Invention

The present invention relates to a voltage drop circuit for decreasing a supply voltage, and applies the dropped voltage to a ROM.

2. Description of Related Art

FIG. 8 is a circuit diagram showing a conventional voltage drop circuit. In FIG. 8, the reference numeral 1 designates a control circuit for activating one of an active voltage supply circuit 2 or a standby voltage supply circuit 6 in response to the operation mode of a CPU to a ROM 11; 2 designates the active voltage supply circuit for generating a dropped voltage (drain voltage Vd) by decreasing a supply voltage, and for regulating fluctuations of the active voltage applied to the ROM 11; 3 designates an external power supply; 4 designates a comparator for comparing the drain voltage Vd of a transistor 5 with a reference voltage $V_{REF}$ in response to a start command sent from the control circuit 1, and for controlling the on-state resistance of the transistor 5; and 5 designates the P-channel transistor (simply referred to as the transistor from now on) whose on-state resistance is increased when the drain voltage Vd is higher than the reference voltage $V_{REF}$, and is decreased when the drain voltage Vd is lower than the reference voltage $V_{REF}$.

The reference numeral 6 designates the standby voltage supply circuit for generating a dropped voltage by decreasing a supply voltage from an external power supply 7; 8 designates a pull-up resistor; 9 designates a switch that turns on in response to a start command from the control circuit 1; 10 designates a ROM power supply using the dropped voltage produced by the active voltage supply circuit 2 or standby voltage supply circuit 6; and 11 designates the ROM.

Next, the operation of the conventional voltage drop circuit will be described.

For example, when a CPU not shown in this figure enters an access mode of the ROM 11, the control circuit 1 supplies the active voltage supply circuit 2 with a start command so that the CPU can access the ROM 11 by placing it in an active mode. This places the output level of the control circuit 1 at the supply voltage level, the active voltage supply circuit 2 in the active mode, and the standby voltage supply circuit 6 in an inactive mode (because the switch 9 in the standby voltage supply circuit 6 is turned off).

The comparator 4 in the active voltage supply circuit 2 compares, in response to the start command from the control circuit 1, the drain voltage Vd of the transistor 5 with the predetermined reference voltage $V_{REF}$, and causes, when the drain voltage Vd is lower than the reference voltage $V_{REF}$, the transistor 5 to reduce its on-state resistance in order to increase the active voltage applied to the ROM 11, which is reduced by an increase of the current consumption of the ROM 11. Thus, the drain voltage Vd of the transistor 5 increases, and the active voltage applied to the ROM 11 rises to a predetermined voltage (3 V, for example).

On the other hand, the comparator 4 causes, when the drain voltage Vd is higher than the reference voltage $V_{REF}$, the transistor 5 to increase its on-state resistance in order to decrease the active voltage applied to the ROM 11, which is increased by a decrease of the current consumption of the ROM 11. Thus, the drain voltage Vd of the transistor 5 decreases, and the active voltage applied to the ROM 11 falls to the predetermined voltage.

When the CPU enters a mode in which it does not access the ROM 11, or executes a stop instruction, the control circuit 1, which consists of an inverter 12 as shown in FIG. 9, for example, places the ROM 11 in a standby mode, and produces a start command to activate the standby voltage supply circuit 6 to reduce the current consumption of the ROM 11. This places the output level of the control circuit 1 at the ground level, the standby voltage supply circuit 6 in the active mode, and the active voltage supply circuit 2 in the inactive mode because the comparator 4 in the active voltage supply circuit 2 turns off the transistor 5.

Thus, the switch 9 in the standby voltage supply circuit 6 turns on in response to the start command from the control circuit 1, and the pull-up resistor 8 decreases the supply voltage from the external power supply 7, and applies the dropped voltage to the ROM power supply 10. As a result, the ROM power supply 10 applies a fixed standby voltage (3 V, for example) to the ROM 11 with a fixed standby current.

With the foregoing configuration, the conventional voltage drop circuit can regulate fluctuations of the active voltage applied to the ROM 11 due to the fluctuations in the current consumption of the ROM 11. To achieve quick response in regulating the fluctuations, however, an increasing current must be supplied to the comparator 4, and this presents a problem of increasing the current consumption of the active voltage supply circuit 2.

Furthermore, although the ROM 11 becomes accessible from the CPU when the ROM 11 shifts from the standby mode to the active mode, it is not improbable that the CPU cannot read data correctly from the ROM 11 for a moment immediately after the control circuit 1 issues the start command because the dropped voltage is not yet settled at that time.

SUMMARY OF THE INVENTION

The present invention is implemented to solve the foregoing problem. It is therefore an object of the present invention to provide a voltage drop circuit that enables the ROM to read data correctly.

Another object of the present invention is to provide a voltage drop circuit that can reduce the current consumption in the active mode.

According to one aspect of the present invention, there is provided a voltage drop circuit comprising: active voltage generating means for generating, by dropping a supply voltage, an active voltage to be applied to a memory, and for regulating fluctuations of the active voltage; a standby voltage supply circuit for generating, by dropping a supply voltage, a standby voltage to be applied to the memory; and an inhibiting circuit for inhibiting an access of a CPU to the memory for a predetermined time period immediately after the memory shifts from a standby mode to an active mode.

Here, the active voltage generating means may comprise a plurality of active voltage supply circuits connected in parallel, and the voltage drop circuit may further comprise control means for controlling a number of the plurality of active voltage supply circuits to be activated in accordance with a current consumption of the memory.

The control means may restrict the number of the plurality of active voltage supply circuits to be activated to equal to or less than half a total number of the plurality of active voltage supply circuits when a byte access mode is designated as a data read scheme.

The control means may control, in response to an execution command of the CPU that accesses the memory, the number of the plurality of active voltage supply circuits to be activated.

The control means may activate, when the CPU accesses its internal RAM, the standby voltage supply circuit with setting to zero the number of the plurality of active voltage supply circuits to be activated.

The control means may activate, when the CPU accesses its external memory, the standby voltage supply circuit with setting to zero the number of the plurality of active voltage supply circuits to be activated.

The control means may activate, when the CPU enters a mode in which it does not access any memory, the standby voltage supply circuit with setting to zero the number of the plurality of active voltage supply circuits to be activated.

DETAILED DESCRIPTION OF THE PREFERRED EMBODIMENTS

The invention will now be described with reference to the accompanying drawings.

Embodiment 1

Figure 1:
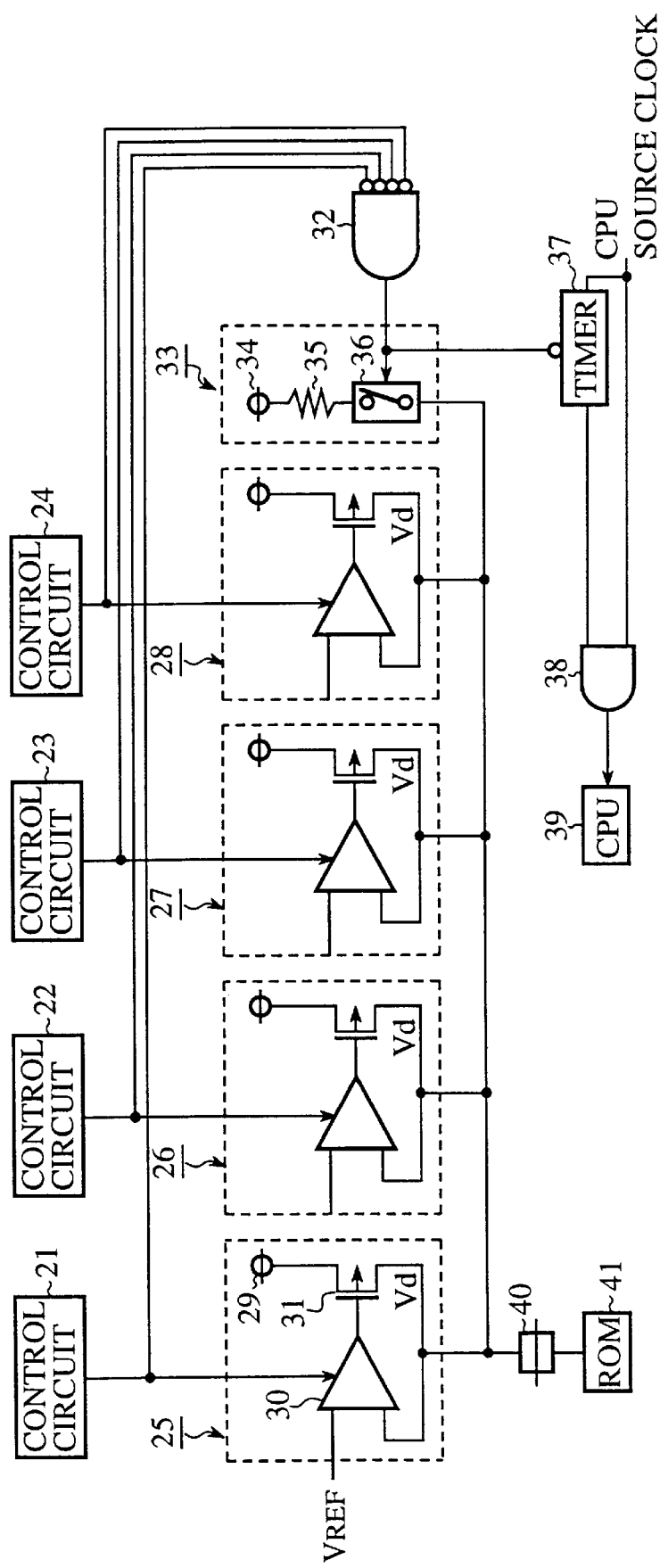
FIG. 1 is a circuit diagram showing an embodiment 1 of a voltage drop circuit in accordance with the present invention.

FIG. 1 is a circuit diagram showing an embodiment 1 of a voltage drop circuit in accordance with the present invention. In FIG. 1, the reference numerals 21–24 each designate a control circuit for deciding, in response to a current consumption of a ROM 41, active voltage supply circuits 25–28 to be activated, and for supplying a NOR circuit 32 with a start command of a standby voltage supply circuit 33 when the ROM 41 changes its state from an active mode to a standby mode; and 25–28 each designate the active voltage supply circuit for generating a dropped voltage (drain voltage Vd) by decreasing a supply voltage, and for regulating fluctuations of the active voltage to be applied to the ROM 41. The reference numeral 29 designates an external power supply; 30 designates a comparator for comparing a drain voltage Vd of a transistor 31 with a reference voltage $V_{REF}$, and for controlling the on-state resistance of the transistor 31; and 31 designates a P-channel transistor (simply referred to as the transistor from now on) that increases its on-state resistance when the drain voltage Vd is higher than the reference voltage $V_{REF}$, and decreases it when the drain voltage Vd is lower than the reference voltage $V_{REF}$.

The reference numeral 32 designates the NOR circuit that outputs a timer count start trigger when at least one of potentials of the start commands supplied from the control circuits 21–24 is placed at a supply voltage level; 33 designates the standby voltage supply circuit for generating a dropped voltage by decreasing a power supply voltage fed from an external power supply 34; 35 designates a pull-up resistor; and 36 designates a switch that turns off in response to the timer count start trigger fed from the NOR circuit 32, and turns on in response to a signal with the supply voltage level fed from the NOR circuit 32.

The reference numeral 37 designates a timer for outputting a ground level signal during a predetermined time period beginning from the timer count start trigger output from the NOR circuit 32; 38 designates an AND circuit that conducts an AND operation between the output signal of the timer 37 and a CPU source clock signal; 39 designates a CPU that accesses the ROM 41; 40 designates a ROM power supply that uses as its power supply the dropped voltage generated by the active voltage supply circuits 25–28 or by the standby voltage supply circuit 33; and 41 designates the ROM.

Next, the operation of the present embodiment 1 will be described.

When the CPU 39 enters an access mode of the ROM 41, the control circuits 21–24 output a start command to activate the active voltage supply circuits 25–28 so that the CPU 39 can access the ROM 41 by placing the ROM 41 in the active mode.

When all the active voltage supply circuits 25–28 are activated, the ROM power supply 40 is supplied with the power corresponding to a maximum current consumption of the ROM 41, which is not necessary when the current consumption of the ROM 41 is less than the maximum.

Taking account of this, the control circuits 21–24 estimate the current consumption of the ROM 41, and decide the number of the active voltage supply circuits 25–28 to be activated in response to the current consumption.

EXAMPLES

When the current consumption of the ROM 41 ranges from 0% to 25% of the maximum current consumption.

Activate only the active voltage supply circuit 25.

When the current consumption of the ROM 41 ranges from 26% to 50% of the maximum current consumption.

Activate the two active voltage supply circuits 25 and 26.

When the current consumption of the ROM 41 ranges from 51% to 75% of the maximum current consumption.

Activate the three active voltage supply circuits 25, 26 and 27.

When the current consumption of the ROM 41 ranges from 76% to 100% of the maximum current consumption.

Activate all the active voltage supply circuits 25, 26, 27 and 28.

Thus, only the active voltage supply circuits receiving the start command with the supply voltage level enter the active mode, with the remaining active voltage supply circuits and the standby voltage supply circuit 33 placed in a inactive mode with the switch 36 in the standby voltage supply circuit 33 being opened.

Each of the comparators 30 in the active voltage supply circuits activated by the control circuits compares the drain voltage Vd of the transistor 31 with the predetermined reference voltage $V_{REF}$, and causes, when the drain voltage Vd is lower than the reference voltage $V_{REF}$, the transistor 31 to reduce its on-state resistance in order to increase the active voltage applied to the ROM 41, which is reduced by an increase of the current consumption of the ROM 41. Thus, the drain voltage Vd of the transistor 31 increases, and the active voltage applied to the ROM 41 rises to a predetermined voltage (3 V, for example).

On the other hand, each of the comparators 30 in the active voltage supply circuits causes, when the drain voltage Vd is higher than the reference voltage $V_{REF}$, the transistor 31 to increase its on-state resistance in order to decrease the active voltage applied to the ROM 41, which is increased by a decrease of the current consumption of the ROM 41. Thus, the drain voltage Vd of the transistor 31 decreases, and the active voltage applied to the ROM 41 falls to the predetermined voltage.

When the CPU 39 enters a mode in which it does not access the ROM 41, or executes a stop instruction, the control circuits 21–24 output a start command of the standby voltage supply circuit 33 in order to reduce the current consumption of the ROM 41 by placing the ROM 41 in the standby mode. This places the output levels of all the control circuits 21–24 at the ground level, which causes the NOR circuit 32 to output a signal with the supply voltage level, thereby closing the switch 3 in the standby voltage supply circuit 33.

As a result, the standby voltage supply circuit 33 enters the active mode, and the active voltage supply circuits 25–28 shift to the inactive mode because the comparators 30 in the active voltage supply circuits turn off the transistor 31.

Thus, the switch 36 in the standby voltage supply circuit 33 closes in response to the signal with the supply voltage level fed from the NOR circuit 32, and the pull-up resistor 35 decreases the supply voltage from the external power supply 34, and applies the dropped voltage to the ROM power supply 40. As a result, the ROM power supply 40 provides the ROM 41 with a fixed standby voltage (3 V, for example) at a fixed standby current.

The ROM 41 operates as described above in the active mode and in the standby mode. The dropped voltage supplied from the active voltage supply circuits 25–28, however, fluctuates for the moment immediately after the start command is output from the control circuits 21–24 (immediately after entering the active mode).

Figure 2:
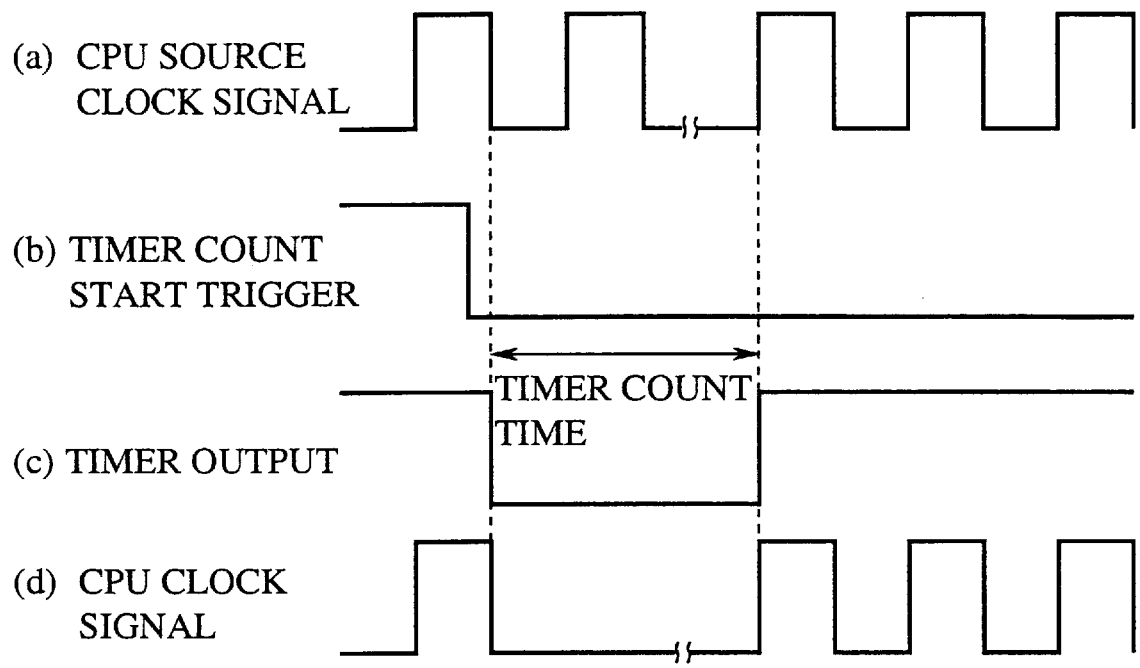
FIG. 2 is a timing chart illustrating the operation of the embodiment 1 when it changes its state from a standby mode to an active mode.

Considering this, the NOR circuit 32 outputs the timer count start trigger when at least one of the potentials of the start commands supplied from the control circuits 21–24 becomes the supply voltage level. In response to the timer count start trigger, the switch 36 in the standby voltage supply circuit 33 opens, and the timer 37 starts counting pulses of the CPU source clock signal when it detects a first falling edge of the source clock signal as illustrated in FIG. 2(a) so that the timer 37 outputs a ground level signal until the count value reaches a predetermined value.

The AND circuit 38 carries out the logical AND operation between the output signal of the timer 37 and the CPU source clock signal, and supplies its result to the CPU 39. Accordingly, as illustrated in FIG. 2(d), the AND circuit 38 outputs a ground level signal while the timer 37 continues the counting, and then a pulse train (CPU clock signal) after the timer 34 completes the counting.

Thus, although the CPU 39 cannot read data from the ROM 41 for a moment immediately after the active mode starts, it can start reading when the predetermined time period has elapsed because supply of the CPU clock signal begins.

As described above, the present embodiment 1 is configured such that it inhibits the access of the CPU 39 to the ROM 41 for the predetermined time period immediately after the ROM 41 shifts from the standby mode to the active mode. This makes it possible to solve the problem involved in the conventional voltage drop circuit in that the CPU can access the ROM while the dropped voltage output from the active voltage supply circuit is still in an unstable state, thereby offering an advantage of being able to improve the reliability of the data read from the ROM 41.

In addition, since the present embodiment 1 is arranged such that it comprises a plurality of active voltage supply circuits connected in parallel, and controls the number of active voltage supply circuits to be activated in response to the current consumption of the ROM 41, it has an advantage of being able to reduce the current consumption in the active mode.

Embodiment 2

Figure 3:
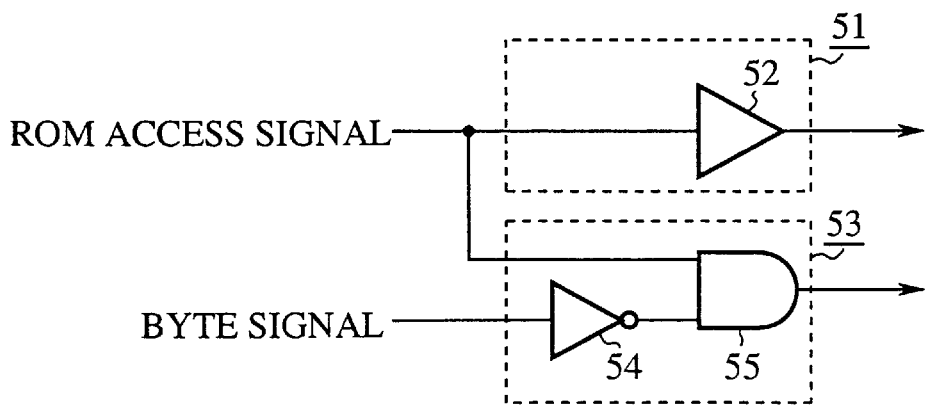
FIG. 3 is a circuit diagram showing a control circuit of an embodiment 2 of the voltage drop circuit in accordance with the present invention.

FIG. 3 is a circuit diagram showing a control circuit of an embodiment 2 of the voltage drop circuit in accordance with the present invention. In FIG. 3, the reference numeral 51 designates a control circuit for outputting a start command of the active voltage supply circuit in response to the ROM access signal fed from the CPU 39. The control circuit 51 comprises a buffer 52 that outputs the start command with the supply voltage level in response to the ROM access signal. The reference numeral 53 designates a control circuit for outputting another start command of the active voltage supply circuit in response to the ROM access signal and a byte signal fed from the CPU 39. The control circuit 53 comprises an inverter 54 and an AND circuit 55.

Next, the operation of the present embodiment 2 will be described.

The control circuit 51 constitutes the control circuits 21 and 23, and the control circuit 53 constitutes the control circuits 22 and 24. When reading data from the ROM 41 through a 16-bit data bus, for example, two access modes can be used: a byte access mode which reads only eight bits at a time, and a word access mode which reads the entire 16 bits at a time. The byte access mode requires only about half the current consumption of the ROM 41 as compared with the word access mode, because the data amount is halved.

When the CPU 39 makes the word access, although the ROM access signal with the supply voltage level is supplied to the buffer 52 in the control circuit 51 and to the AND circuit 55 in the control circuit 53, the byte signal is not supplied to the inverter 54 in the control circuit 53. Thus, the inverter 54 is supplied with a ground level signal.

Accordingly, both the buffer 52 in the control circuit 51 and the AND circuit 55 in the control circuit 53 output the start commands of the active voltage supply circuits with the supply voltage level. In other words, all the active voltage supply circuits 25–28 receive the start commands, although only the active voltage supply circuits 25 and 26 can be supplied with the start commands as in the foregoing embodiment 1 when the current consumption of the ROM 41 is smaller.

When the CPU 39 carries out the byte access, on the other hand, the ROM access signal with the supply voltage level is fed to the buffer 52 in the control circuit 51 and to the AND circuit 55 in the control circuit 53, and the byte signal with the supply voltage level is supplied to the inverter 54 in the control circuit 53.

Thus, although the buffer 52 in the control circuit 51 outputs the start command of the active voltage supply circuit with the supply voltage level, the AND circuit 55 in the control circuit 53 does not output the start command of the active voltage supply circuit with the supply voltage level. Accordingly, only the active voltage supply circuits 25 and 27 receive the start commands, although only the active voltage supply circuit 25 can be supplied with the start command as in the foregoing embodiment 1 when the current consumption of the ROM 41 is smaller.

When the CPU 39 does not carry out the read access, neither the buffer 52 in the control circuit 51 or the AND circuit 55 in the control circuit 53 is supplied with the ROM access signal, but they are supplied with ground level signals.

As a result, neither the buffer 52 in the control circuit 51 or the AND circuit 55 in the control circuit 53 outputs the start command with the supply voltage level. In other words, the start command is not supplied to any of the active voltage supply circuits 25–28.

As described above, the present embodiment 2 is configured such that when the byte access mode is designated as the data read scheme, the number of the active voltage supply circuits to be activated is reduced to equal to or less than half the total number. This offers an advantage of being able to reduce the current consumption in the byte access mode to about half the amount required in the word access mode.

Embodiment 3

Figure 4:
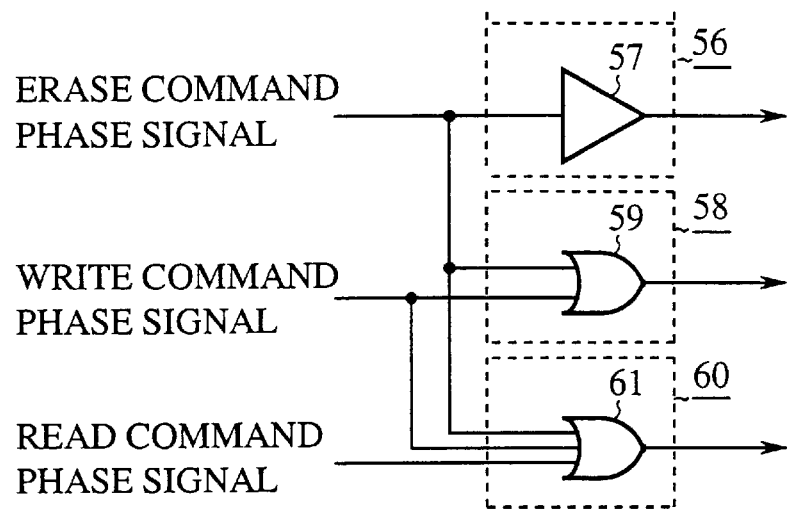
FIG. 4 is a circuit diagram showing the control circuit of an embodiment 3 of the voltage drop circuit in accordance with the present invention.

FIG. 4 is a circuit diagram showing a control circuit of an embodiment 3 of the voltage drop circuit in accordance with the present invention. In FIG. 4, the reference numeral 56 designates a control circuit for producing a start command of the active voltage supply circuit in response to an erase command phase signal fed from the CPU 39. The control circuit 56 comprises a buffer 57 that outputs a signal with the supply voltage level in response to the erase command phase signal.

The reference numeral 58 designates a control circuit for producing another start command of the active voltage supply circuit in response to the erase command phase signal or a write command phase signal fed from the CPU 39. The control circuit 58 comprises a two-input OR circuit 59 that outputs a signal with the supply voltage level in response to the erase command phase signal or the write command phase signal.

The reference numeral 60 designates a control circuit for producing still another start command of the active voltage supply circuits in response to the erase command phase signal, the write command phase signal or a read command phase signal fed from the CPU 39. The control circuit 60 comprises a three-input OR circuit 61 that outputs a signal with the supply voltage level in response to the erase command phase signal, the write command phase signal or the read command phase signal.

Next, the operation of the present embodiment 3 will be described.

For example, the control circuits 56, 58 and 60 are each installed by the same number so that they each constitute one third of the total number of the control circuits. In addition, it is assumed in the following description that the ROM 41 is an erasable and rewritable ROM as a flash EEPROM.

When the CPU 39 executes an erase command, the erase command phase signal with the supply voltage level is fed to the buffer 57 in the control circuit 56, the two-input OR circuit 59 in the control circuit 58 and the three-input OR circuit 61 in the control circuit 60, which in turn each output the start command (with the supply voltage level) of the active voltage supply circuits. In other words, all the active voltage supply circuits are supplied with the start commands, although the start commands can be supplied to a smaller number of the active voltage supply circuits as in the foregoing embodiment 1 when the current consumption of the ROM 41 is smaller.

When the CPU 39 executes the write command, the write command phase signal with the supply voltage level is supplied to the two-input OR circuit 59 in the control circuit 58 and the three-input OR circuit 61 in the control circuit 60, but not to the buffer 57 in the control circuit 56. Thus, the start commands of the active voltage supply circuits (with the supply voltage level) are output from the two-input OR circuit 59 in the control circuit 58 and the three-input OR circuit 61 in the control circuit 60, but not from the buffer 57 in the control circuit 56.

As a result, the start commands are supplied to two thirds of all the active voltage supply circuits, although the start commands can be supplied to a smaller number of the active voltage supply circuits than the two thirds as in the foregoing embodiment 1 when the current consumption of the ROM 41 is smaller.

When the CPU 39 executes the read command, the read command phase signal with the supply voltage level is supplied to the three-input OR circuit 61 in the control circuit 60, but not to the buffer 57 in the control circuit 56 or the two-input OR circuit 59 in the control circuit 58. Thus, the start command of the active voltage supply circuits (with the supply voltage level) is output from the three-input OR circuit 61 in the control circuit 60, but not from the buffer 57 in the control circuit 56 or from the two-input OR circuit 59 in the control circuit 58.

As a result, the start commands are supplied to one third of all the active voltage supply circuits, although the start commands can be supplied to a smaller number of the active voltage supply circuits than the one third as in the foregoing embodiment 1 when the current consumption of the ROM 41 is smaller.

As described above, the present embodiment 3 is configured such that the number of the active voltage supply circuits to be activated is controlled in response to the command of the CPU 39 that accesses the ROM 41. This offers an advantage that the execution of the read command or write command requires a smaller amount of current consumption of the active voltage supply circuits than the execution of the erase command.

Embodiment 4

Figure 5:
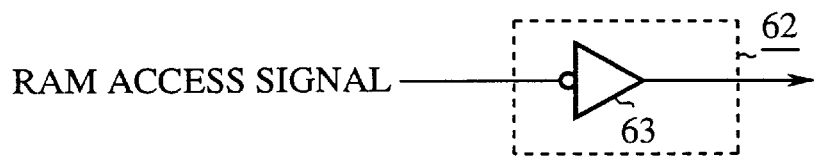
FIG. 5 is a circuit diagram showing the control circuit of an embodiment 4 of the voltage drop circuit in accordance with the present invention.

FIG. 5 is a circuit diagram showing a control circuit of an embodiment 4 of the voltage drop circuit in accordance with the present invention. In FIG. 5, the reference numeral 62 designates a control circuit for producing the start command of the standby voltage supply circuit 33 in response to a RAM access signal fed from the CPU 39. The control circuit 62 comprises an inverter 63 that outputs a ground level signal in response to the RAM access signal.

Next, the operation of the present embodiment 4 will be described.

When the CPU 39 accesses its internal RAM, it will never access the ROM 41. In this case, placing the ROM 41 in the standby mode can reduce the current consumption of the ROM 41, and reduce to zero the current consumption of the active voltage supply circuits 25–28.

The control circuit 62, which constitutes the control circuits 21–24, causes the NOR circuit 32 to output the start command (with the ground level) of the standby voltage supply circuit 33 in response to the RAM access signal indicating that the RAM is being accessed. Thus, the standby voltage supply circuit 33 is activated and the active voltage supply circuits 25–28 are halted.

As described above, the present embodiment 4 is arranged such that while the CPU 39 accesses the RAM, it activates none of the active voltage supply circuits 25–28, but the standby voltage supply circuit 33. This offers an advantage of being able to further reduce the current consumption of the voltage drop circuit.

Embodiment 5

Figure 6:
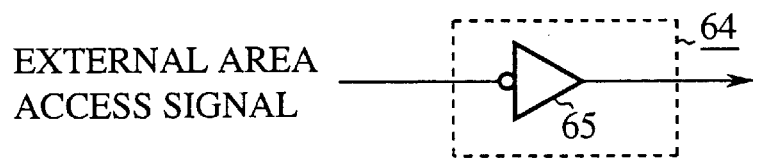
FIG. 6 is a circuit diagram showing the control circuit of an embodiment 5 of the voltage drop circuit in accordance with the present invention.

FIG. 6 is a circuit diagram showing a control circuit of an embodiment 5 of the voltage drop circuit in accordance with the present invention. In FIG. 6, the reference numeral 64 designates a control circuit for producing the start command of the standby voltage supply circuit 33 in response to an external area access signal fed from the CPU 39. The control circuit 64 comprises an inverter 65 that outputs a ground level signal in response to the external area access signal.

Next, the operation of the present embodiment 5 will be described.

When the CPU 39 accesses an external memory, it will never access the ROM 41. In this case, placing the ROM 41 in the standby mode can reduce the current consumption of the ROM 41, and reduce to zero the current consumption of the active voltage supply circuits 25–28.

The control circuit 64, which constitutes the control circuits 21–24, causes the NOR circuit 32 to output the start command (with the ground level) of the standby voltage supply circuit 33 in response to the external area access signal (with the supply voltage level) indicating that the external memory is being accessed. Thus, the standby voltage supply circuit 33 is activated, and the active voltage supply circuits 25–28 are halted.

As described above, the present embodiment 5 is arranged such that while the CPU 39 accesses the external memory, it activates none of the active voltage supply circuits 25–28, but the standby voltage supply circuit 33. This offers an advantage of being able to further reduce the current consumption of the voltage drop circuit.

Embodiment 6

Figure 7:
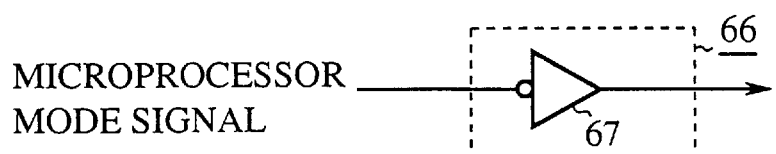
FIG. 7 is a circuit diagram showing the control circuit of an embodiment 6 of the voltage drop circuit in accordance with the present invention.
Figure 8:
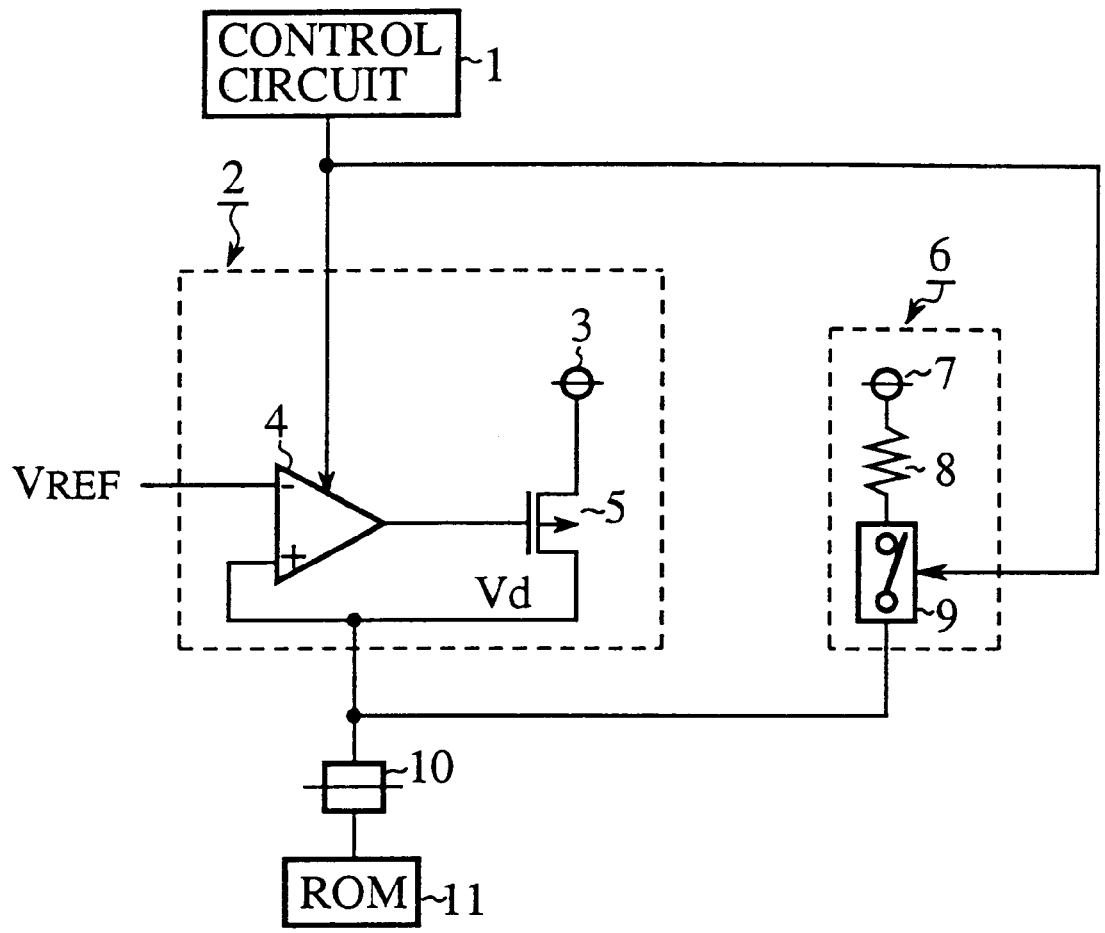
FIG. 8 is a circuit diagram showing a conventional voltage drop circuit.
Figure 9:
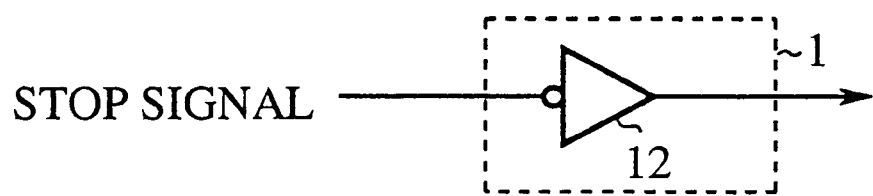
FIG. 9 is a circuit diagram showing the control circuit of the conventional voltage drop circuit of FIG. 8.

FIG. 7 is a circuit diagram showing a control circuit of an embodiment 6 of the voltage drop circuit in accordance with the present invention. In FIG. 7, the reference numeral 66 designates a control circuit for producing the start command of the standby voltage supply circuit 33 in response to a microprocessor mode signal fed from the CPU 39. The control circuit 66 comprises an inverter 67 that outputs a ground level signal in response to the microprocessor mode signal.

Next, the operation of the present embodiment 6 will be described.

When the CPU 39 enters a mode that does not gain access to the ROM 41, it will never access the ROM 41. In this case, placing the ROM 41 in the standby mode can reduce the current consumption of the ROM 41, and zero the current consumption of the active voltage supply circuits 25–28.

The control circuit 66, which constitutes the control circuits 21–24, causes the NOR circuit 32 to output the start command (with the ground level) of the standby voltage supply circuit 33 in response to the microprocessor mode signal (with the supply voltage level) fed from the CPU 39. Thus, the standby voltage supply circuit 33 is activated and the active voltage supply circuits 25–28 are halted.

As described above, the present embodiment 6 is arranged such that when the CPU 39 enters the mode in which it does not access the ROM 41, it activates none of the active voltage supply circuits 25–28, but the standby voltage supply circuit 33. This offers an advantage of being able to further reduce the current consumption.

What is claimed is:

1. A voltage drop circuit comprising:
    active voltage generating means for generating, by dropping a supply voltage, an active voltage to be applied to a memory, and for regulating fluctuations of the active voltage;
    a standby voltage supply circuit for generating, by dropping a supply voltage, a standby voltage to be applied to the memory; and
    an inhibiting circuit for inhibiting an access of a CPU to the memory for a predetermined time period immediately after the memory shifts from a standby mode to an active mode.

2. The voltage drop circuit according to claim 1, wherein said active voltage generating means comprises a plurality of active voltage supply circuits connected in parallel, and wherein said voltage drop circuit further comprises control means for controlling a number of said plurality of active voltage supply circuits to be activated in accordance with a current consumption of the memory.

3. The voltage drop circuit according to claim 2, wherein said control means restricts the number of said plurality of active voltage supply circuits to be activated to equal to or less than half a total number of said plurality of active voltage supply circuits when a byte access mode is designated as a data read scheme.

4. The voltage drop circuit according to claim 2, wherein said control means controls, in response to an execution command of the CPU that accesses the memory, the number of said plurality of active voltage supply circuits to be activated.

5. The voltage drop circuit according to claim 2, wherein said control means activates, when the CPU accesses its internal RAM, said standby voltage supply circuit with setting to zero the number of said plurality of active voltage supply circuits to be activated.

6. The voltage drop circuit according to claim 2, wherein said control means activates, when the CPU accesses its external memory, said standby voltage supply circuit with setting to zero the number of said plurality of active voltage supply circuits to be activated.

7. The voltage drop circuit according to claim 2, wherein said control means activates, when the CPU enters a mode in which it does not access any memory, said standby voltage supply circuit with setting to zero the number of said plurality of active voltage supply circuits to be activated.

* * * * *